United States Patent
Hopkins et al.

(10) Patent No.: US 10,636,538 B2
(45) Date of Patent: Apr. 28, 2020

(54) ALFVÉN-WAVE GYRATING NON-LINEAR INERTIAL-CONFINEMENT REACTOR

(71) Applicant: Delta Research LLC, Olympia, WA (US)

(72) Inventors: Demitri Joseph Hopkins, Tigard, OR (US); Eric Michael Thomas, Beaverton, OR (US)

(73) Assignee: Agni Energy, Inc., Lacey, WA (US)

( * ) Notice: Subject to any disclaimer, the term of this patent is extended or adjusted under 35 U.S.C. 154(b) by 1074 days.

(21) Appl. No.: 14/855,259

(22) Filed: Sep. 15, 2015

(65) Prior Publication Data

US 2016/0078973 A1 Mar. 17, 2016

Related U.S. Application Data

(60) Provisional application No. 62/051,173, filed on Sep. 16, 2014, provisional application No. 62/051,177, (Continued)

(51) Int. Cl.
*H05H 6/00* (2006.01)
*G21K 1/093* (2006.01)
(Continued)

(52) U.S. Cl.
CPC ............... *G21K 1/093* (2013.01); *H05H 3/06* (2013.01); *H05H 6/00* (2013.01); *G21B 1/03* (2013.01);
(Continued)

(58) Field of Classification Search
CPC ..... G21B 1/00; G21B 1/03; G21B 1/05; G21B 1/11; G21B 1/23
See application file for complete search history.

(56) References Cited

U.S. PATENT DOCUMENTS 4,568,509 A 2/1986 Cvijanovich et al.
4,633,208 A 12/1986 Voss et al.
(Continued)

FOREIGN PATENT DOCUMENTS

GB 1049561 A 11/1966
JP H01-204341 A 8/1989
(Continued)

OTHER PUBLICATIONS

International Patent Application No. PCT/US2015/050266; Int'l Preliminary Report on Patentability; dated Mar. 30, 2017; 6 pages.
(Continued)

*Primary Examiner* — Marshall P O'Connor
(74) *Attorney, Agent, or Firm* — BakerHostetler

(57) ABSTRACT

A fusion reactor includes an improved ability to modulate a plasma for specific purposes. The reactor operates on the ability to change at least four separate variables in each of a plurality of lenses that are independent of the other lenses. This allows for the generation of Alfvén waves and modulation of the internal plasma dynamics, actively leading to higher states of efficiency. By combining modulation of a plasma in the form of an ion beam with a solid state metal target, an efficient fast neutron source can be produced. This can lead to industrial applications such as energy generation, nuclear clean-up, the production of rare earth metals out of semi-rare ones, and helium production.

5 Claims, 11 Drawing Sheets

Related U.S. Application Data filed on Sep. 16, 2014, provisional application No. 62/051,181, filed on Sep. 16, 2014.

(51) Int. Cl.
| | | |
|---|---|---|
| *H05H 3/06* | (2006.01) | |
| *G21B 1/03* | (2006.01) | |
| *G21B 1/19* | (2006.01) | |
| *H05H 7/00* | (2006.01) | |
| *H01J 37/14* | (2006.01) | |
| *H05H 7/04* | (2006.01) | |

(52) U.S. Cl.
CPC .............. *G21B 1/19* (2013.01); *H01J 37/14* (2013.01); *H05H 2007/007* (2013.01); *H05H 2007/043* (2013.01)

(56) References Cited

U.S. PATENT DOCUMENTS

| | | | |
|---|---|---|---|
| 4,985,634 | A | 1/1991 | Stengl et al. |
| 5,930,313 | A | 7/1999 | Slinker et al. |
| 7,067,807 | B2 | 6/2006 | Petrov et al. |
| 2003/0042411 | A1 | 3/2003 | Leung et al. |
| 2006/0049348 | A1 | 3/2006 | Petrov et al. |
| 2006/0289801 | A1 | 12/2006 | Matsuba |
| 2007/0257207 | A1 | 11/2007 | Frosien et al. |
| 2008/0230694 | A1 | 9/2008 | Frosien |
| 2011/0233431 | A1 | 9/2011 | Wan et al. |
| 2012/0181444 | A1 | 7/2012 | Tahmassebpur |
| 2013/0108022 | A1 | 5/2013 | Kugland et al. |

FOREIGN PATENT DOCUMENTS

| | | |
|---|---|---|
| JP | H11-109097 A | 4/1999 |
| JP | 2003-337200 A | 11/2003 |
| JP | 2007-066796 A | 3/2007 |

OTHER PUBLICATIONS

Goncharov et al.; "Manipulating Large-Area, Heavy Metal Ion Beams with a High-Current Electrostatic Plasma Lens"; IEEE Transactions on Plasma Science; vol. 28 No. 6; Dec. 2000; p. 2238-2246.

Goncharov et al.; "Plasma Devices for Ion Beam and Plasma Deposition Applications"; Problems of Atomic Science and Technology; No. 1 Series: Plasma Physics; 2005; p. 169-171.

European Patent Application No. 15843121.3; Partial Supplementary Search Report; dated Apr. 20, 2018; 16 pages.

European Patent Application No. 15843121.3; Extended Search Report; dated Aug. 3, 2018; 13 pages.

International Patent Application No. PCT/US2015/50266; Int'l Search Report and the Written Opinion; dated Apr. 29, 2016; 14 pages.

Wesson, John, and David J. Campbell. Tokamaks. vol. 149. Oxford University Press, 2011, p. 2.†

Goldston, Robert J., and Paul Harding Rutherford. Introduction to plasma physics. CRC Press, 1995, p. 174-75.†

† cited by third party

ALFVÉN-WAVE GYRATING NON-LINEAR INERTIAL-CONFINEMENT REACTOR

CROSS REFERENCE TO RELATED APPLICATIONS

This application claims benefit under 35 U.S.C. § 119(e) to U.S. Provisional Patent Application No. 62/051,173, filed Sep. 16, 2014, entitled "Alfvén-Wave Gyrating Non-Linear Inertial-Confinement Reactor"; U.S. Provisional Patent Application No. 62/051,177, filed Sep. 16, 2014, entitled "Electromagneto-Dynamic Variable Aperture Lens"; and U.S. Provisional Patent Application No. 62/051,181, filed Sep. 16, 2014, entitled "Solid State Target for Fusion Purposes". The content of each of these applications is hereby incorporated by reference in its entirety.

TECHNICAL FIELD

The present system for fusion generally relates to the technical field of plasma physics. A background in plasma physics, magnetohydrodynamics, particle physics, ion optics, and plasma fusion devices is helpful for understanding this technology. An illustrative embodiment utilizes variable electromagnetic aperture lenses for increased feedback control and the ability to generate Alfvén waves in an active plasma to better reach confinement against a target plate. (In plasma physics, an Alfvén wave is a type of magnetohydrodynamic wave in which ions oscillate in response to a restoring force provided by an effective tension on the magnetic field lines.)

BACKGROUND

Controlled nuclear fusion has been a goal of scientists for several decades with billions of dollars spent to develop such an energy resource. Most systems seek to ignite fusion by confining a fusile fuel either through magnetic confinement or inertial confinement. The confinement of charged particles, the presence of instabilities, and the large amount of energy required to sustain the reacting system at high temperatures all make this one of the most challenging world-wide efforts. Many different configurations have been proposed and tested, but no energy and cost efficient reactors have been realized to date.

For example, ongoing experiments put on by the National Ignition Facility (NIF), located at Lawrence Livermore National Laboratory, have attempted to achieve fusion using laser focusing, which uses rays of light to heat a target to fusion. This process does not use an ion beam. Instead, electromagnetic radiation is aimed at a target that includes a capsule containing hydrogen gas of deuterium and tritium in pellet form. Precise timing and coordination of the laser light's incidence on the target capsule is required to prevent disruptive instabilities from forming in the fusion reaction.

Furthermore, previous work and research in this field was performed by inventors of this patent, Eric Thomas and Demitri Hopkins. This previous technology used a linear ion beam aimed at a heavy-water ice target to induce sublimation and provide the deuterium needed for fusion, with the ion beam focused by non-moving electrostatic lenses.

The state of the art also includes the use of electrostatic lenses in a field called "ion optics", where electrostatic potentials are created with electrostatic lenses to focus or broaden the spray of ions for different purposes (e.g., for use in scanning electron microscopes). It further includes magnetic coil wrappings, such as Helmholtz coils. Finally, previous art also includes the camera shutter, which is used to control the amount of light entering a camera.

SUMMARY

A fusion reactor designed to maximize possible variables and combinations increases the ability to study and modulate a plasma for specific purposes. The reactor operates on the ability to change at least four separate variables in each of a plurality of lenses that are independent of the other lenses. This allows for waveforms and other time-based variables to be brought into the functioning, which allows for the generation of Alfvén waves and modulation of the internal plasma dynamics, actively leading to higher states of efficiency. By combining modulation of a plasma in the form of an ion beam with a solid state metal target, an efficient fast neutron source can be produced. Such a device has tested very successfully in simulation and shows promising results of break-even fusion. This in turn may lead to many industrial applications such as energy generation, nuclear cleanup, the production of rare earth metals out of semi-rare ones, and helium production.

DETAILED DESCRIPTION OF ILLUSTRATIVE EMBODIMENTS

Figure 1:
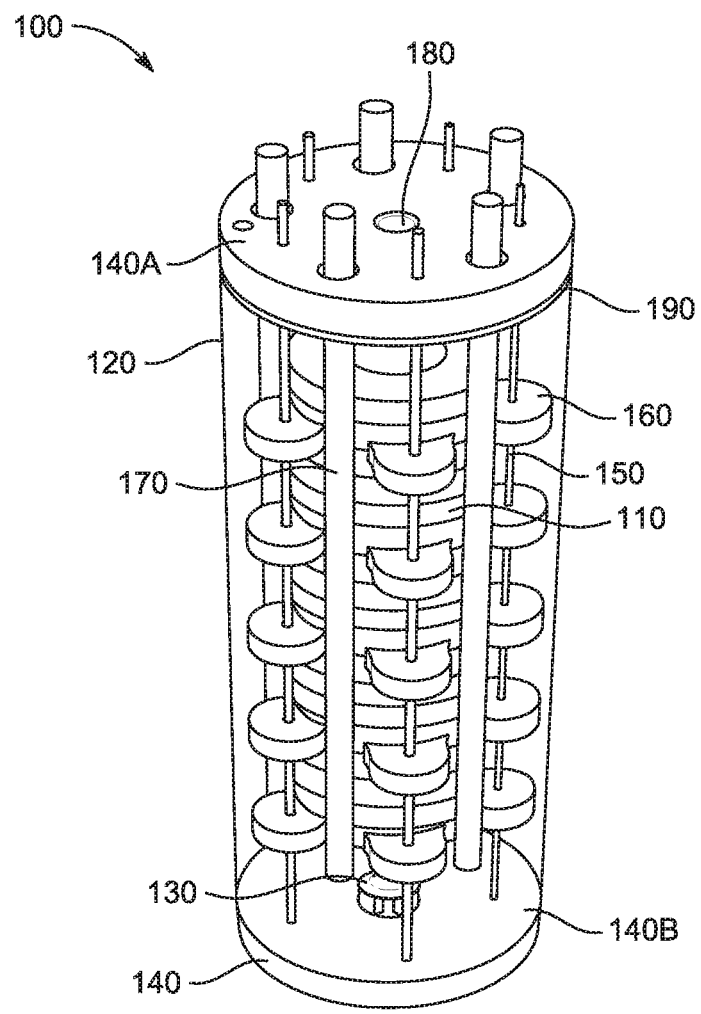
FIG. 1 is a view of a fusion reactor in accordance with an illustrative embodiment without electrical systems and with the reactor wall removed so that the reactor interior can be viewed.
Figure 2:
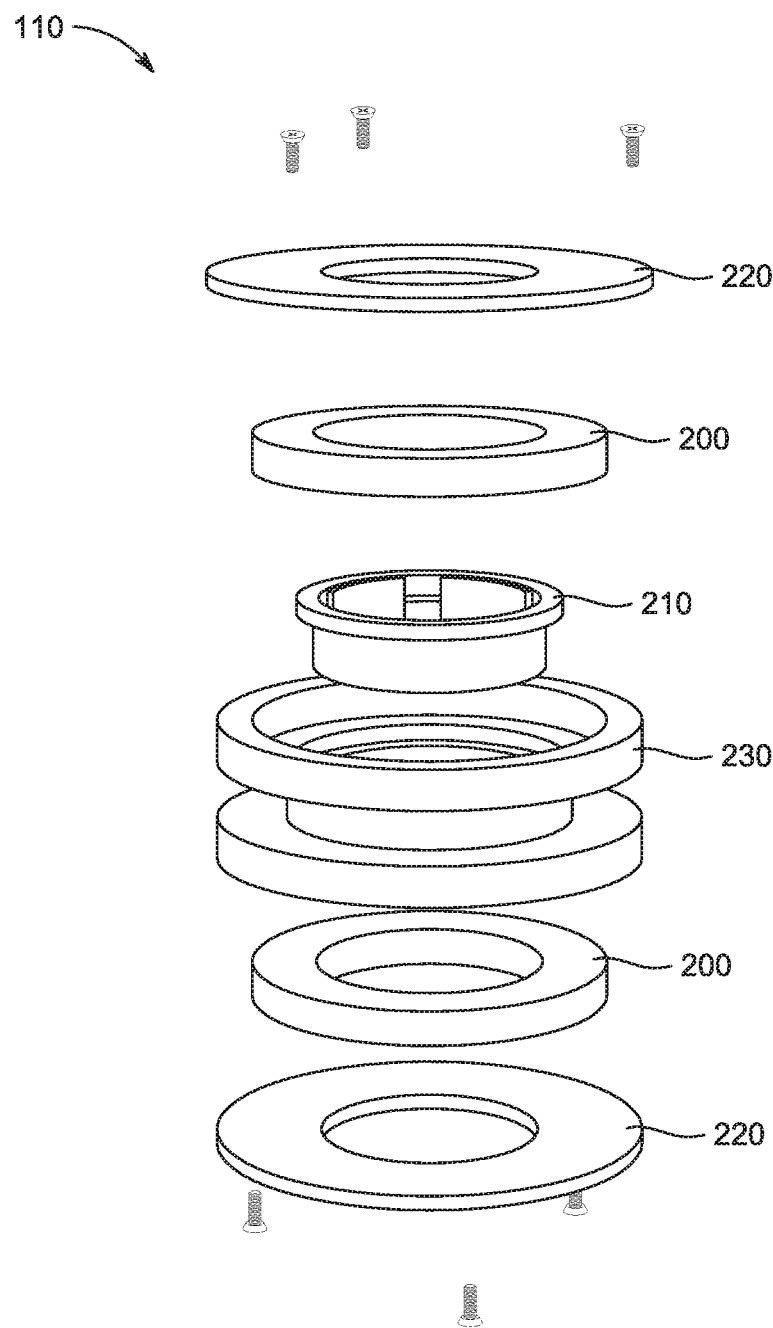
FIG. 2 is an exploded view of a variable lens illustrated in FIG. 1.

FIG. 1 depicts an overall view of the fusion reactor without electrical systems hooked up that can be used, in one exemplary embodiment, for the efficient commercial production of electricity. The fusion reactor 100 includes a plurality of ion lenses 110, a target plate 130, and an ion source 180. Ions passing through the lenses 110 form an ion beam that ultimately strikes the target plate to facilitate fusion at the target plate. The reactor system relies on variable electromagneto lenses 110 and a target 130 comprising a solid metal structure to achieve fusion. An exploded view of a variable lens 110 is shown in FIG. 2. In FIG. 2, the variable lens 110 includes a simplified placeholder for a shutter 200. Preferred or illustrative embodiments of the various structures are described below.

Solid State Target for Fusion Purposes

Figure 3:
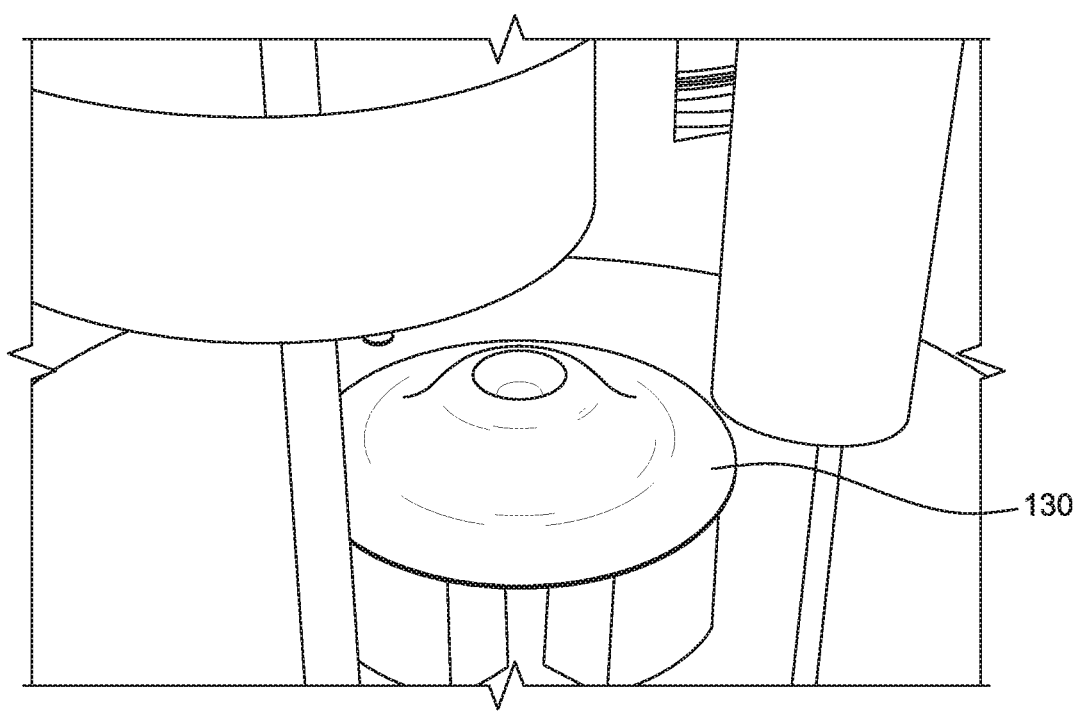
FIG. 3 is a close up view of an exemplary target plate located at the end of an ion beam source and for use in a plasma apparatus for fusion purposes.
Figure 10:
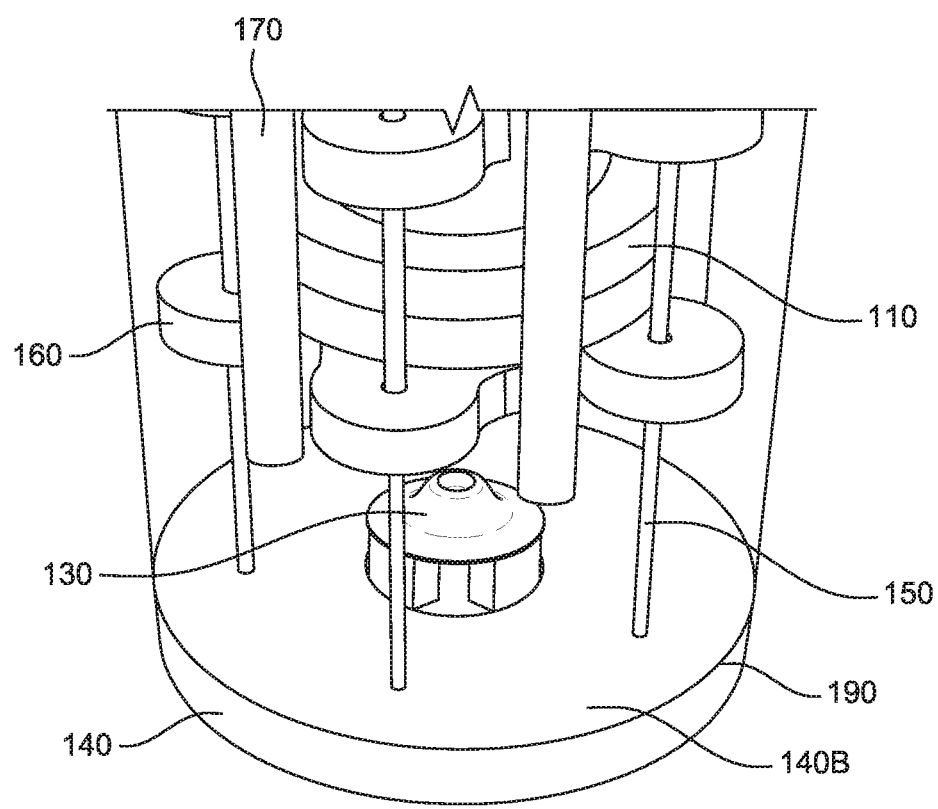
FIG. 10 is a close up image of the end of the reactor showing one lens, the vertical control rods, the lens diameter control rods, the vertical control nodes, and the target plate with hole for vacuum below it.

FIG. 3 illustrates a close-up of the target plate 130 located at the bottom of the reactor pictured in FIG. 1. Similarly, FIG. 10 depicts a close up image of the end of the reactor showing one lens 110, the vertical control rods 150, the lens diameter control rods 170, the vertical control nodes 160, and the target plate 130 with a hole for vacuum below it. The target plate 130 is a new concept model in fusion and plasma physics that is designed to optimize confinement of a plasma against the solid target in order to increase the amount of fusion reactions. In general, the target plate is situated as the end of an ion beam's path and is where the plasma strikes to maximize fusion reactions. In one embodiment, the target plate is arranged near the reactor target plate end 140b opposite the ion source 180. Ions entering the reactor can be formed into a beam by electrostatic lenses, hollow cathodes, cyclotrons, and other means for ionizing gases into an ion beam. The ion beam can be arranged in either a linear or non-linear flow with a path that ends when the beam strikes the target plate. The target plate can also sustain a charge and thus direct the flow of ions towards, around, or against it. In one embodiment, holes for a vacuum connection are arranged below the target plate. In this way, a vacuum can be pumped on the whole apparatus.

The materials available to be used in the target plate for optimal fusion include a deuterium or tritium containing solid material like lithium deuteride, lithium borodeuteride, lithium tritide, lithium borotritide, palladium enriched with deuterium or tritium. These examples should not be construed as limiting, as other materials could be used to enhance different kinds of fusion in order to generate different kinds of energy expression. However, for the purposes of generating the most energy output to input in the reactor, hydrogen containing solids as a class are preferred. The entire class of hydrogen containing solids would work to varying degrees. The target plate can currently be manufactured by machine shopping, laser cutting, or 3D printing the desired material into the target plate. Furthermore, the plate can be constantly refreshed by moving in more material to be the target. In this way the reactor can be replenished with fuel in order to consistently produce electricity or provide a source of fast neutrons. Applying this technology, including a solid state metal target for fusion purposes, could increase the efficiency of fusion massively in comparison to other known techniques.

Electromagneto-Dynamic Variable Aperture Lens

An electromagneto-dynamic variable aperture lenses (a 'variable lens' and collectively the 'variable lenses') in accordance with the present invention applies four separate variables within one lens to control ion optics. This allows an advanced specificity of control over the ion beam flow and feedback controls. The lens, as described herein, is to be applied in place of typical non-variable electrostatic lenses to increase specificity and control over ion optics and the path of ion beams. The four variables are as follows: (1) diameter of the electrostatic lens; (2) vertical position of the electrostatic lens; (3) strength of the electrostatic field; and (4) strength of the magnetic field. By adjusting these variables, minute aspects of the particle beam can be controlled with great specificity. They further allow for more specific feedback control over standard lenses that change only the strength of the electrostatic field and/or the strength of the magnetic field. An enhanced degree of control is achieved by being able to modulate the variable lenses' radial diameter and vertical position as well as the strength of electrostatic field and strength of magnetic field.

Figure 4:
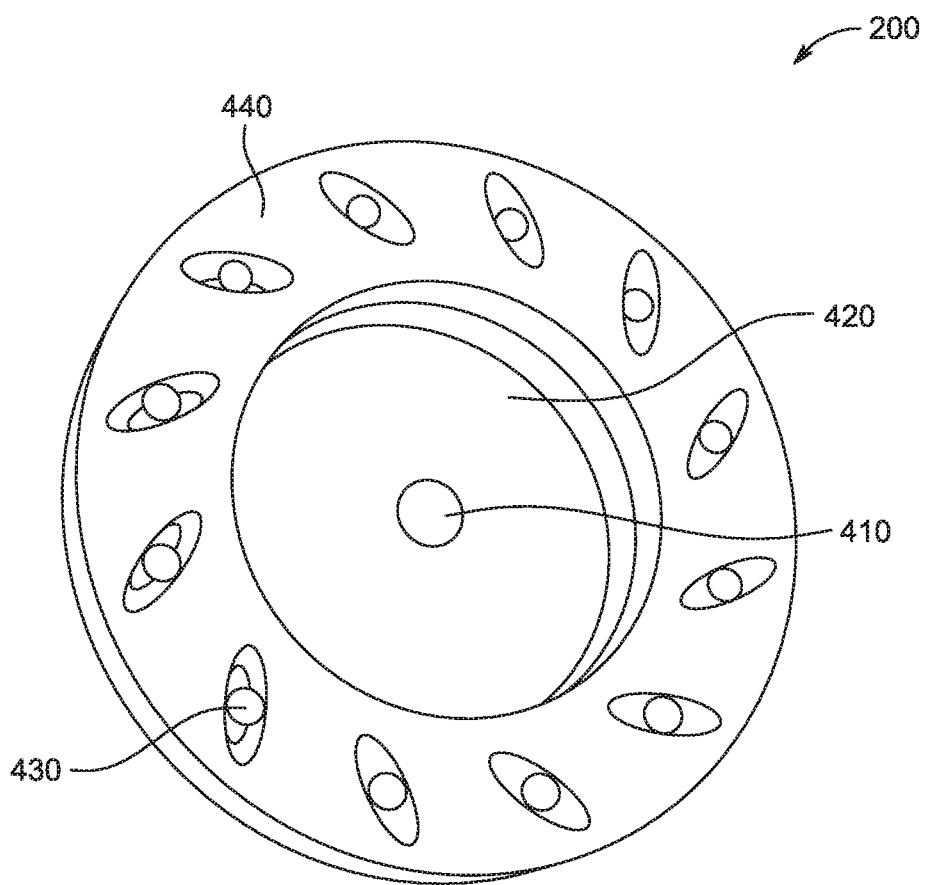
FIG. 4 is a view of the shutter mechanism of the variable lens illustrated in FIG. 2.
Figure 9:
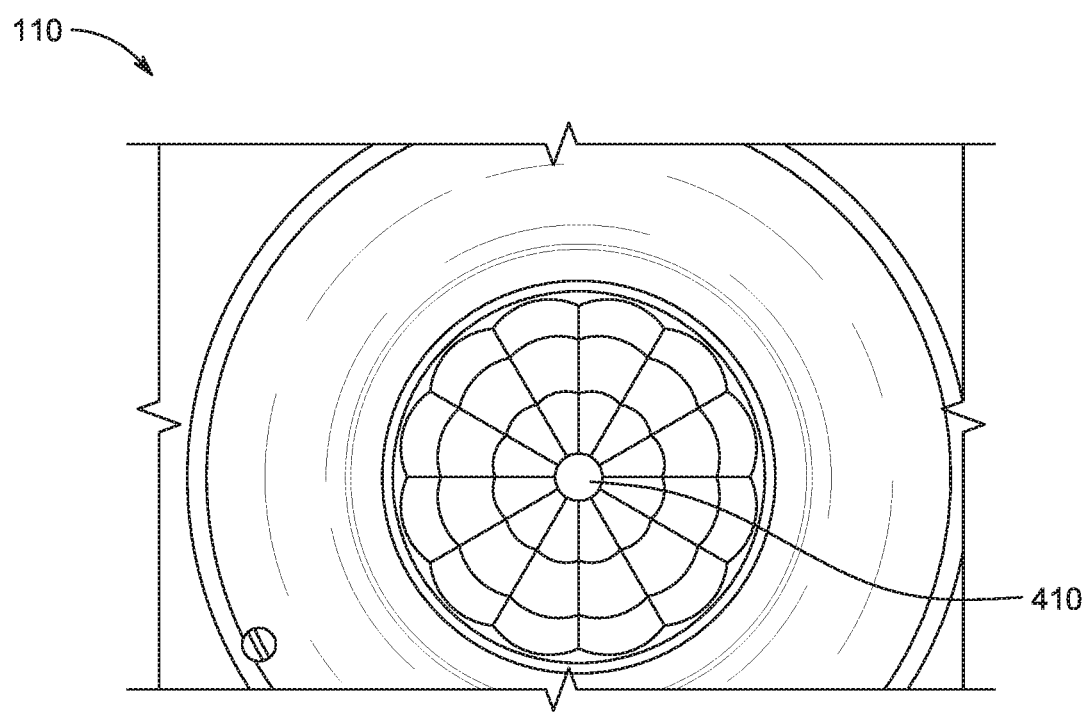
FIG. 9 is a close up image looking down into the shutter at the blades. The blades can be seen overlapping, each blade approximately the shape of an arc, coming together to make an exposed circular hole at the center. The second shutter for the same lens can been through the hole.

FIG. 2 is an illustration of an embodiment of a variable lens 110 with a simplified placeholder for a shutter 200. FIG. 4 is an illustration of the shutter and its components in more detail. The lens 110 has two end caps 220 constructed from material electricity cannot arc to (e.g., anti-static plastic), which hold the whole lens together and prevent arcing between separate lenses. Inside the end caps there are two electrostatic lens shutters 200. The shutters are similar to a camera shutter but are further able to have an electrostatic charge applied to them. They have a similar lensing effect on ions passing through the shutter as a camera shutter does on passing photons. The shutters are further composed of a series of metal blades 420 that voltage can be applied to. The metal blades are controlled by a set of shutter control pins 430 situated within the shutter housing 440. More specifically, a variable charge can be applied to the shutters by connecting a pin on each of the shutters to a variable voltage source. Shutter adjustment is achieved by rotating a gear operatively connected to the pins and that is rotated by a lens diameter control rod 170. As the pins are moved by the gear, the blades 420 rotate, causing the diameter of the center hole to change. As illustrated in FIG. 9, the blades overlap, with each blade approximately the shape of an arc, and come together to make an exposed circular hole at the center of the shutter. Both shutter components 200 are put in synchrony to maintain the integrity of the electrostatic lens. The shutter diameter is capable of ranging from all the way open (matching the diameter of the static component 210) to all the way closed and blocking the flow of ions.

A magnetic lens tract 230 connects directly to the lens caps 220 and holds within it the shutters 200 and a static component of the electrostatic lens 210. Magnet wire, such as enamel coated wire, is repeatedly wrapped around a groove in the magnetic lens tract 230. A magnetic field is generated by applying a voltage to the wrapped wires. By varying the voltage applied to the wrapped magnet wire, the magnitude of the magnetic field strength can be controlled. Within the magnetic lens tract 230 and closer to the radial center is the static component of the electrostatic lens 210. The static component 210 is also connected to a variable voltage source. The static component 210 determines the outermost possible diameter of the electrostatic lens as a single field and normalizes the electric field lines between the two shutter components of the lens. Although the shutters 200, magnetic lens tract 230, and static component 210 can all be configured to have variable charge, in one embodiment they remain in synchrony with each other to properly control the electrostatic lens.

Figure 5:
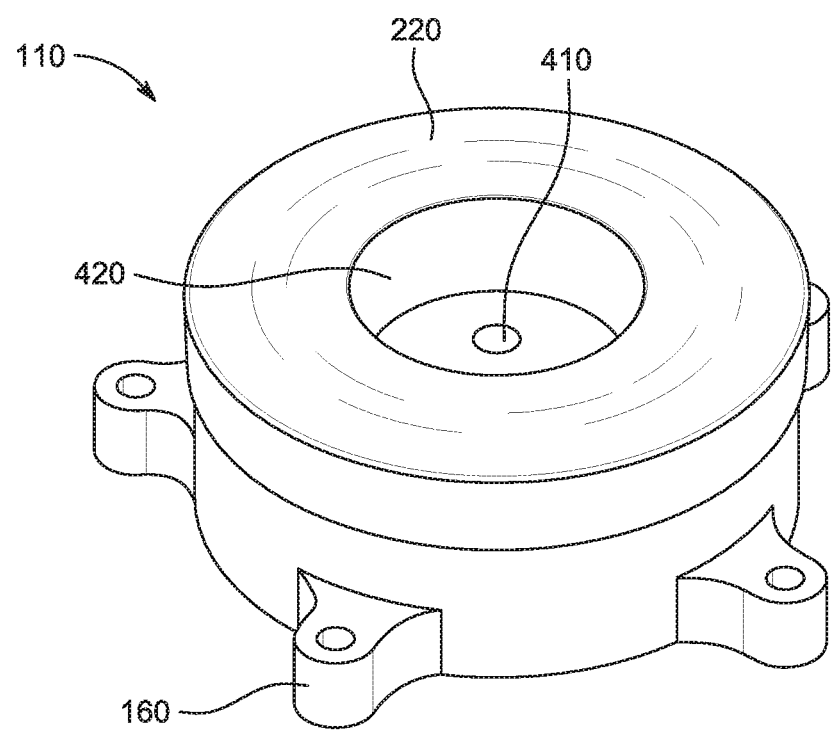
FIG. 5 is an image of a fully constructed lens with the vertical control nodes attached.

FIG. 5 illustrates a variable lens 110 with control nodes 160 attached, and with general similar features to FIG. 2. In one embodiment, a variable lens can be vertically adjusted using a servomotor operatively connected to a vertical control rod 150. The control rod is threaded through a vertical control node 160 attached to the variable lens to be vertically adjusted. When the servomotor turns the control rod, the control rotates and causes the variable lens to move up or down along the control rod 150 as a result of the threaded connection. Multiple control rods and corresponding vertical control nodes may be utilized for each vertical lens. In this way the vertical position of a variable lens may be controlled. With this structure, each lens provides four independently controllable variables and, and each lens can be independently controlled.

Figure 6:
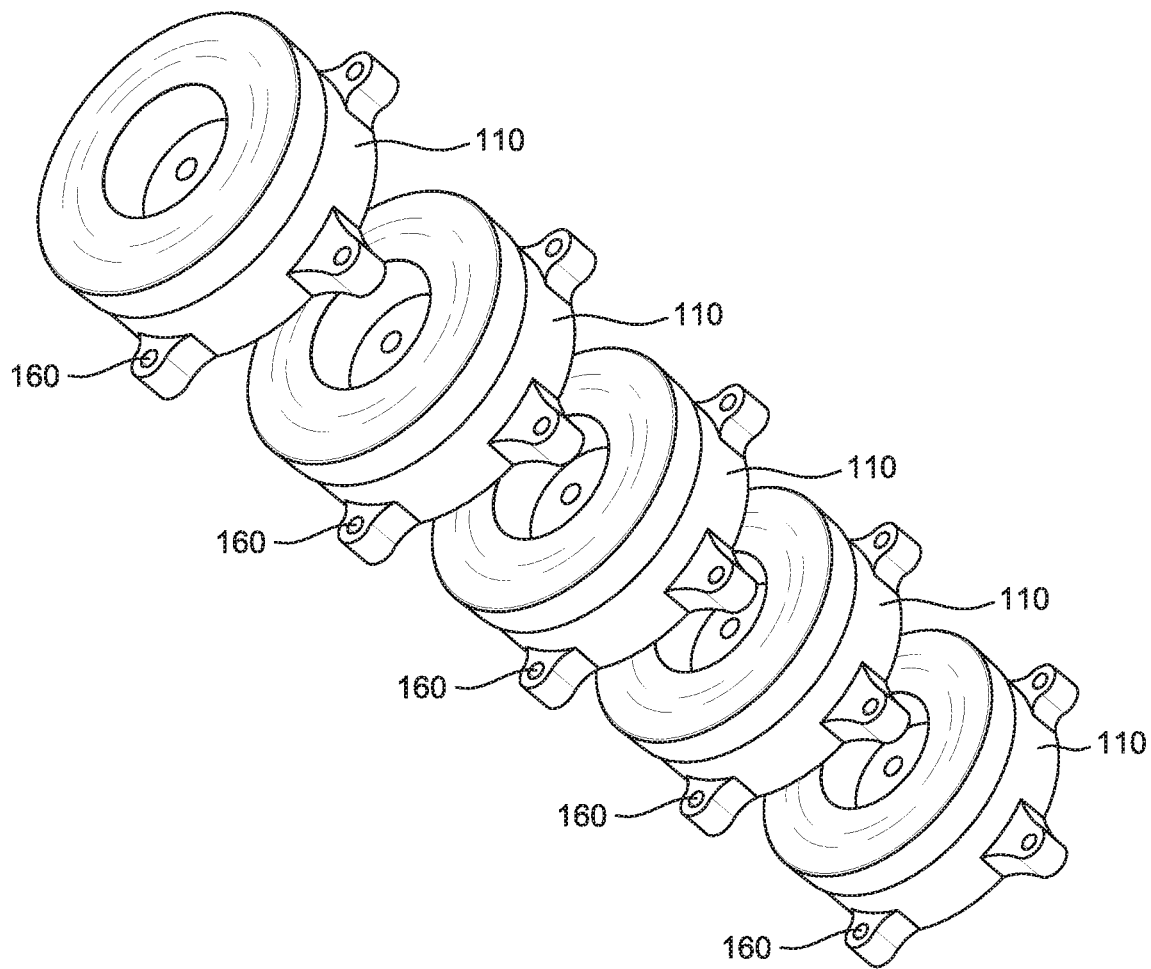
FIG. 6 is a view of five of the lenses illustrated in FIG. 5 in alignment without other parts of the reactor to better see their position in the reactor core.
Figure 7:
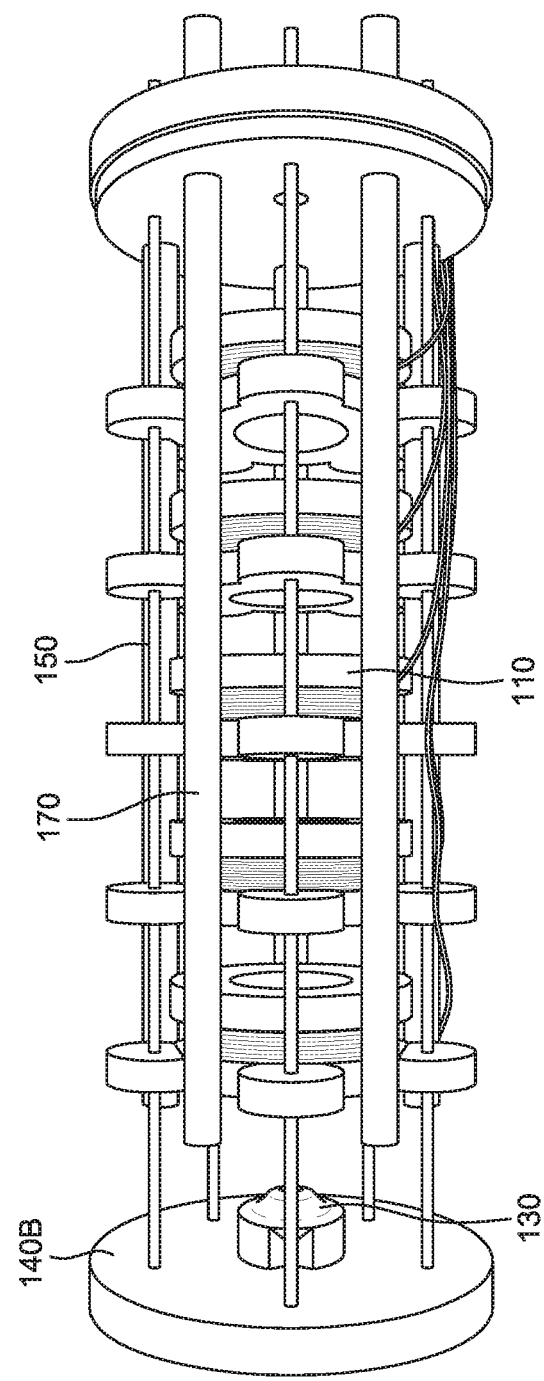
FIG. 7 is a side view of a reactor as in FIG. 1 allowing the vertical motion of the lenses to be easily conceptualized.
Figure 8:
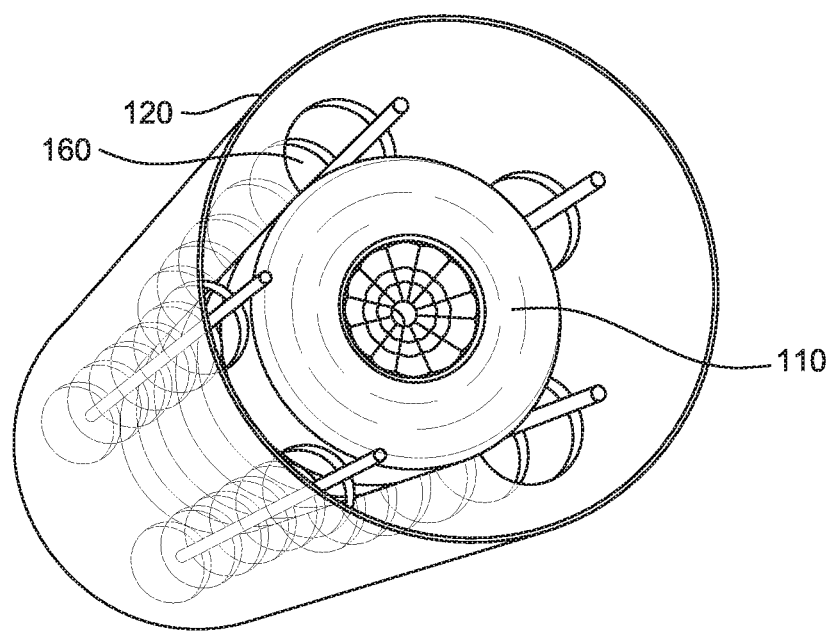
FIG. 8 is a view of the reactor without end caps and rotated to look down through the lenses, with the shutter mechanism set at one-fourth diameter. The blades can be viewed overlapping to create the shutter effect.

FIG. 6 is a view of five of the lenses 110 illustrated in FIG. 5 in alignment without other parts of the reactor to better see their position in the reactor core. FIGS. 7-8 illustrate two views of the reactor as in FIG. 1 in embodiment comprising five lenses. The vertical motion of the lenses 110 can be easily conceptualized. FIG. 8 is a view of the reactor without end caps and rotated to look down through the lenses, with the shutter mechanism set at one fourth diameter. The blades can be viewed overlapping to create the shutter effect. Further illustrated in FIG. 8 is a reactor shield 120 for containing the reaction and within which are the reactor components.

A variable lens as described herein may be installed after build into an electron microscope or into a fusion reactor. Components of the variable lens could be made by machine shopping, 3D printing, laser cutting, or some combination thereof. Once a lens is constructed, it can be installed by affixing it into its location based on the machinery it is being added to. Such variable lenses could further be used in a range of electron optics work for more controlled and targeted electron and ion beams. In any application of an electrostatic or magnetic lens this application could be used to increase the degree of specificity of the beam. Stacked in progression this technology could be employed as part of a plasma apparatus to study the time dependent variables of plasma and feedback control systems. Stacked in progression this technology could be used as part of a plasma apparatus for sustainable nuclear fusion of many types.

Fusion Reactor

A consistent challenge to achieving controlled fusion reactions is the formation of instabilities in the highly complex system that forms internal to plasmas. Without multi-variable channels to combat these instabilities, they end up growing into insurmountable problems that end halt the entire reaction. For example, the NIF model would ideally compress the deuterium-tritium fuel in a perfectly spherically symmetrical implosion. However, even minute turbulences can cause instability in the symmetry of the implosion, ultimately lowering the heating of the fuel, reducing maximum compression, and greatly diminishing fusion efficiency. With only one or two modulatable variables, the complex instabilities cannot be targeted in an efficient manner. Because the plasma is entirely confined the instabilities have a natural tendency to grow. An additional problem is that ions must have an enormous amount of magnetic force applied to them to confine the plasma to a great enough degree to achieve fusion. Current models require magnetic fields on the order of 40,000 times stronger than the earth's magnetic field. The reactor described herein utilizes a large number of variables that can be modulated to control the plasma and respond to instabilities actively leading to increased efficiency. This technology also employs a target plate that significantly reduces the necessary energy for confinement, allowing the reactor to be successfully operated at much lower energies per reaction.

A reactor designed to maximize possible variables and combinations increases the ability to study and modulate a plasma for specific purposes. It has tested very successfully in simulation and shows promising results of break-even fusion. It operates on the ability to change four separate variables in each of a plurality of lenses that are independent of the other lenses. This allows for waveforms and other time based variables to be brought into the functioning, which allows for such things as the generation of Alfvén waves and modulation of the internal plasma dynamics actively leading to higher states of efficiency. This in turn may lead to many industrial applications such as energy generation, nuclear clean-up, the production of rare earth metals out of semi-rare ones, and helium production.

A reactor in accordance with the present invention is designed to optimize the potential range in which the reactor can be operated. FIG. 1 depicts an overall view of the fusion reactor without electrical systems hooked up that can be used, in one exemplary embodiment, for the efficient commercial production of electricity. The fusion reactor 100 includes a plurality of ion lenses 110, a target plate 130, and an ion source 180. Ions passing through the lenses 110 form an ion beam that ultimately strikes the target plate 130 to facilitate fusion at the target plate.

The ion beam can be controlled by the plurality of ion lenses 110 which have four variables that can be independently modulated as described above. The four variables for each lens include the: (1) diameter of electrostatic lens; (2) vertical position of electrostatic lens; (3) strength of electrostatic field; and (4) strength of magnetic field. With this structure, each lens provides four independently controlled variables and, and each lens can be independently controlled.

Figure 11:
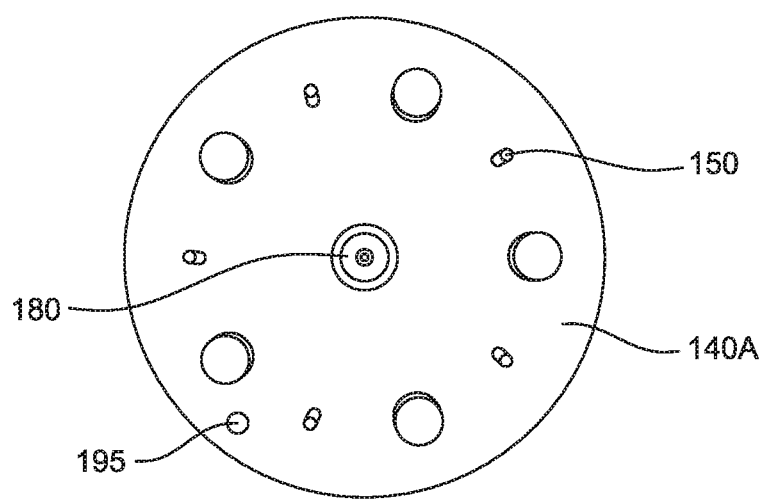
FIG. 11 is an image looking down at the reactor to see the control rods, both vertical and lens diameter, where they will be attached to servomotors, as well as the center hole for an ion source and the hole for wiring the electrical components to interior reactor components.

The reactor 100 includes end pieces 140A and 140B as well reactor wall 120. FIG. 11 is an image looking down at the reactor to see the vertical control rods 150 and the lens diameter control rods 170, where they will be attached to servomotors (not pictured), as well as the center hole for an ion source 180 and the hole 195 for wiring the electrical components to interior reactor components. These components are made out of material electricity cannot arc to (e.g., anti-static plastic) to prevent arcing of the plasma. They are further sealed together in order to hold a vacuum on the entire device to best operate the plasma. A hole in the reactor ion source end piece 140A is where ions enter the reactor from the ion source 180. In one embodiment the ion source 180 is a hollow cathode, however the ion source can be interchangeable without further modifications needing to be made to the reactor design. Wire is threaded through another hole 195 in the end piece 140A to connect a high voltage supply to the lenses 110 in order to apply an electrostatic and magnetic force, accounting for two of the four variables per lens that are actively modulatable.

The vertical control nodes 160 and vertical control rods 150 are also constructed with material electricity cannot arc to (e.g., anti-static plastic). Outside of the reactor interior, and not pictured in FIG. 1, a high precision and fast motor (e.g., a servomotor) is operatively connected to each control rod 150 and is capable of rotating each control rod. All of the control rods 150 are threaded, but only one of the control nodes 160 for each of the five lenses is threaded, at a different radial position for each lens. In this manner, applying electricity to a motor spins the connected control rod 150, which in turn raises or lowers the lens in its represented vertical position—giving one of the four actively modulatable variables per lens. Thus each lens of the reactor can be moved both up and down vertically while the reactor is running, and independently of the other lenses. The vertical movement is relative to an axis defined by the general path of the ion beam.

Also pictured are the lens diameter control rods 170. These rods are likewise constructed with material that electricity cannot arc to. As described above, each lens diameter control rod 170 is operatively connected to a gear which moves the pins 430 (illustrated in FIG. 4) to control the diameter of the electrostatic lens at the shutter. The shutter diameter is capable of ranging from all the way open (matching the diameter of the static component 210) to all the way closed and blocking the flow of ions. This provides the fourth variable per lens, with each lens being able to be operated independently of the others.

The target plate 130 is located near the reactor target plate end 140B at the end of the reactor. Ions are accelerated through the lenses 110 from the ion source 180 and gain momentum and inertial confinement until finally striking the target plate—maximizing confinement density. In one embodiment, the ions follow a spiral path through the reactor 100 before striking the target. Thus the ion beam may be either linear or non-linear. A wide range of materials can be incorporated in the solid metal target plate for different types of fusion, with denser materials being more optimal. The target material can be chosen based on what kind of fusion needs to be initiated. In a preferred embodiment, a vacuum is connected through holes in the reactor target plate end 140B placed below the target plate. The vacuum lowers the pressure in the reactor and normalizes the content of the reactor's internal gas. In further embodiments, the vacuum may be connected at another reactor surface, such as the reactor wall 120. Like the ion source, the vacuum connection can be changed without affecting the overall function or operability of the reactor.

In one illustrative embodiment described herein, the reactor comprises a five lens design. In the five lens design, the reactor may have up to twenty five active variables that may be actively modulated while the reactor is being run. First, the five lenses provide for twenty separately controllable variables for modulating the plasma using the lenses (based on four individually modulatable variables per lens). This leads to a far advanced range of operable conditions in which the reactor can be run. Four further variables include: the charge placed on the two individual pieces of the hollow cathode ion source 180, where deuterium (or tritium) is pumped in; the rate at which deuterium (or tritium, or other elements excited to gaseous state) is pumped in; and the vacuum pulled on the reactor, which pulls the post process gas out of the reactor. A final variable is the voltage placed on the target plate to attract the ions to strike the target.

In between runs different materials can be substituted to be fused, providing another variable that is not able to be modulated during the active process (hereby called a static variable). Some examples of target materials include lithium deuteride (or tritide), lithium borodeuteride (or borotritide), and deuterium (or tritium) enriched palladium. These are all materials which contain high levels of deuterium (or tritium) for the fusion process. Other materials could be utilized for different kinds of fusion, and would be functional in this reactor design so long as they followed the solid target design.

In such a configuration, there are a total of twenty five active variables that can modulate the plasma state, as well as the single static variable of the material the plasma strikes (the target plate). By changing the solid target plate material, the function of the reactor may be changed as different target plates may be optimal for different kinds of fusion, and the removal of the target plate could be used to form a fusion ion thruster.

Each of the active variables can be independently set to a stationary mode to explore different modes of functionality. In one embodiment, the active variables can also be in motion throughout the process in patterned, random, or semi-random motion. In another embodiment, the reactor could be run with a preset motion that can be actively changed by a feedback control system to monitor and change the plasma for instabilities that form. This also allows for changes in variables for start-up and shut-down procedures that could optimize time needed for start-up and shut-down. Having all of these variables in states of change while the reactor is running could be used to optimize the plasma for different functional roles and to explore non-static electromagnetic fields on an active plasma.

A fusion reactor as described herein could be used in a wide array of applications that can utilize an efficient fast neutron source. Such applications might include, for example: energy generation, flight, space travel, and transmutation. This technology allows for significantly more modulation and can allows for many more possible expressions of plasmas through the device. Waveforms of vertical and diameter motion in tandem with offset waveforms of magnetic and electrostatic strength in the focusing lenses have shown major success in simulation exceeding the Q=1 expression in plasma physics referring to equal energy input to output. In fact, it has shown such success in simulation it has exceeded this Q=1 limit by over 4-fold with simulated energy input below 100 kilowatt levels. As far as the applicants are aware, this level of efficiency in a fast neutron source has never been achieved and has not been modeled on simulators before this design.

As such, this device can provide an efficient fast neutron source through the process of nuclear fusion with applications into the public and private sector. Perhaps the most noteworthy application in the private sector is energy production, as it is the first break-even model of fusion reactor designed that overcomes instabilities. The reactor described herein could be used for cheaper cost-to-production energy generation in a sustainable manner. In one embodiment the reactor could be set up as a full power generating station much like a fission power plant. It would continuously take in hydrogen as fusile material and the resulting energy, in the form of high energy neutrons, could be used to produce electricity. For example, the high energy neutrons from the fusion process could be used to create steam (or another heat conducting fluid) in order to run a conventional electricity-generating turbine.

In another embodiment, the fusion reactions could be utilized as a fast neutron source for the purposes of transmutation of heavy elements such as tantalum and niobium into gold, platinum, palladium and rhodium. A medium scale reactor could be built to cycle elements through it (e.g., tantalum) and react them through fast neutron bombardment into more desirable elements (e.g., platinum). This process could be used to sell heavy metals that have a higher market capital due to rarity than the pre-process material. Another application of transmutation with this technology is the conversion of radioactive waste into lighter stable elements for radioactive waste elimination. By placing the radioactive waste in close proximity to the fast neutron flux, the radioactive waste would be forced to undergo alpha decay into lighter more stable elements for radioactive waste elimination. A facility could be constructed around this technology to eliminate radioactive waste at spill sites across the world.

Helium is a byproduct of hydrogen fusion. As helium supplies dwindle, this reactor could be set up to recapture helium after the hydrogen fusion. Such a recapture configuration could be viable on its own or could be utilized in conjunction with other purposes. The helium could be sold as a product, potentially creating a new sustainable supply of helium.

In another embodiment, the fusion reactor could be utilized as a fast neutron source to be used in a combined fusion-fission reactor. For example, Thorium is a fissile material that is much more abundant on Earth as compared to Uranium or other traditional fissile materials. Moreover, thorium has various physical and nuclear properties that are superior to Uranium, is more resistant to nuclear weapons proliferation, and reduces plutonium and actinide production. It further does not require extensive enrichment processes and is not capable of sustaining a nuclear chain reaction (unlike Uranium). Because it does not chain react, the Thorium cycle requires another neutron source in order to initiate the fuel cycle. The fusion reactor described herein could provide a neutron source—even if not running at full break-even—to facilitate the thorium fuel cycle and provide a clean source of energy production without the possibility of meltdown.

In yet another embodiment, the reactor could be made into a fusion ion thruster for more efficient space travel that solves the thrust gained to weight needed to bring up issue that currently makes space flight very expensive. The fusion would generate large amounts of energy in the form of ions that are then propelled out the back of the thruster at much higher speeds then typical fuel thrusters, allowing for significantly less fuel consumption per distance of thrust and much higher maximum speeds. In yet another embodiment, the ion thruster configuration could be modified again, still using this core model and only adding external components, into a jet engine that could maintain a much more fuel efficient model of plane.

Conclusion

Different examples of the apparatuses and methods disclosed herein include a variety of components, features, and functionalities. It should be understood that the various examples of the apparatuses and methods disclosed herein may include any of the components, features, and functionalities of any of the other examples of the apparatuses and methods disclosed herein in any combination, and all of such possibilities are intended to be within the spirit and scope of the present disclosure. Many modifications of examples set forth herein will come to mind to one skilled in the art to which the present disclosure pertains having the benefit of the teachings presented in the foregoing descriptions and the associated drawings. Therefore, it is to be understood that the present disclosure is not to be limited to the specific examples presented and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims.

We claim:

1. A method for modulating a plasma using a fusion reactor with feedback control systems to independently control a plurality of variables, the method comprising:
   directing an ion flow into the reactor;
   adjusting at least one variable lens, wherein the ion flow is directed through the at least one lens;
   positioning a solid state target plate for optimizing confinement of the plasma against the target plate, wherein the solid state target plate is formed of deuterium or tritium containing solid materials; and
   applying a voltage to the target plate to attract ions in the plasma.

2. The method of claim 1, further comprising attaching a vacuum source to the reactor to increase the efficiency of fusion reactions and remove waste materials from the reactor.

3. The method of claim 1, wherein the solid materials include lithium deuteride, lithium borodeuteride, or lithium borotritide.

4. The method of claim 2, wherein the solid state target is formed of a hydrogen-containing solid.

5. The method of claim 1, wherein each lens has a plurality of independently modulatable variables, and wherein the plurality of independently modulatable variables includes at least: the vertical position of the lens within the reactor, the diameter of the aperture of the lens, and the electric field within the lens.

* * * * *